(12) United States Patent
Ofuji et al.

(10) Patent No.: US 12,158,551 B2
(45) Date of Patent: Dec. 3, 2024

(54) RADIATION IMAGING APPARATUS AND MANUFACTURING METHOD OF SAME

(71) Applicant: CANON KABUSHIKI KAISHA, Tokyo (JP)

(72) Inventors: Masato Ofuji, Gunma (JP); Yoshito Sasaki, Tokyo (JP); Masato Inoue, Saitama (JP); Takamasa Ishii, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 445 days.

(21) Appl. No.: 17/542,256

(22) Filed: Dec. 3, 2021

(65) Prior Publication Data

US 2022/0187481 A1    Jun. 16, 2022

(30) Foreign Application Priority Data

Dec. 11, 2020    (JP) .................................. 2020-205575

(51) Int. Cl.
  *G01T 1/20*    (2006.01)
  *H01L 27/146*    (2006.01)

(52) U.S. Cl.
  CPC ...... *G01T 1/20189* (2020.05); *G01T 1/20184* (2020.05); *H01L 27/14661* (2013.01); *H01L 27/14663* (2013.01); *H01L 27/14685* (2013.01); *H01L 27/1469* (2013.01); *H01L 27/14603* (2013.01)

(58) Field of Classification Search
  CPC ... G01T 1/20; G01T 1/20184; G01T 1/20189; G01T 1/202; H01L 27/14603; H01L 27/14612; H01L 27/14643; H01L 27/14661; H01L 27/14663; H01L 27/14683; H01L 27/14685; H01L 27/1469
  See application file for complete search history.

(56) References Cited

U.S. PATENT DOCUMENTS

| | | | |
|---|---|---|---|
| 6,372,608 B1 * | 4/2002 | Shimoda ........... | H01L 21/76254 438/455 |
| 2003/0047280 A1 * | 3/2003 | Takayama ............ | H10K 59/123 257/E27.111 |
| 2010/0193691 A1 * | 8/2010 | Ishii .................. | H01L 27/14663 156/247 |

FOREIGN PATENT DOCUMENTS

JP    5142943 B2    2/2013

* cited by examiner

*Primary Examiner* — Mark R Gaworecki
(74) *Attorney, Agent, or Firm* — Canon U.S.A., Inc. IP Division

(57) ABSTRACT

A method of manufacturing a radiation imaging apparatus includes electrically connecting a first surface of a flexible insulating layer to a conductive portion of a circuit substrate, covering an exposed portion of the conductive portion with a protection layer, and separating the flexible insulating layer from a substrate in contact with a second surface of the flexible insulating layer. The circuit substrate includes an integrated circuit mounted on the circuit substrate. The flexible insulating layer includes, on the first surface, a plurality of pixels arranged in a two-dimensional matrix to convert radiation into an electrical signal. The second surface of the flexible insulating layer is opposite to the first surface of the flexible insulating layer. The flexible insulating layer is separated from the substrate by irradiating the second surface with light transmitting through the substrate.

16 Claims, 13 Drawing Sheets

(a) PIXEL FORMATION STEP (b) SCINTILLATOR AND MOISTURE-
PROOF LAYER FORMATION STEP (e) SEPARATION STEP (f) CLEANING STEP

RADIATION IMAGING APPARATUS AND MANUFACTURING METHOD OF SAME

BACKGROUND

Field

The present disclosure relates to a radiation imaging apparatus and a method of manufacturing a radiation imaging apparatus.

Description of the Related Art

A manufacturing technique for display devices using thin-film transistors (TFTs) has been applied to matrix panels for large-area sensors including TFTs and semiconductor photoelectric conversion elements. A matrix panel is used as a radiation detection apparatus in combination with a scintillator configured to convert radiation into light. A matrix panel is typically formed on a glass substrate; however, flexible matrix panels using a resin, and the like, have been developed to hold promise for a reduction in the weight of the apparatus as well as for the durability against impact and deformation, and the flexible matrix panels are also being used in radiation detection apparatuses.

A typical method of forming a flexible matrix panel is to place a thin film of a flexible insulating layer made of a resin material, or the like, on a rigid substrate such as a glass substrate, form an area sensor on the flexible insulating layer, and then remove the substrate. For example, Japanese Patent No. 5142943 discusses a method in which a flexible insulating layer is first formed on a substrate such as glass, and then a matrix panel is formed on the flexible insulating layer. The matrix panel is then coupled to a readout circuit and a drive circuit via a wiring member, such as a flexible printed board (FPC), and then the substrate is separated by laser light irradiation.

When the flexible insulating layer is irradiated with intense light such as laser light in a separation process (step), a portion of the flexible insulating layer is ablated (photothermal evaporation). At this point, expansion of generated gas causes separation at the interface between the substrate and the flexible insulating layer, and simultaneously generates a conductive foreign substance (e.g., soot) on a surface of the flexible insulating layer.

Typically, FPCs have exposed portions of electrodes, and a short circuit may occur between wiring lines of the FPC if soot adheres across the exposed portions of a plurality of different electrodes. This results in a connection failure with the drive circuit and causes an operation failure of the matrix panel. Furthermore, this results in a connection failure with the readout circuit and causes a readout failure, i.e., a failure to read out a signal from the matrix panel. There are various methods for removing (cleaning) soot, but cleaning may, on the contrary, spread the soot and have a risk of causing the above-described failure.

SUMMARY

The present disclosure is directed to providing a manufacturing method that may reduce a short circuit between wiring lines of an FPC due to soot in a radiation imaging apparatus using a flexible matrix panel, and a radiation imaging apparatus that is less likely to cause a short circuit between wiring lines of an FPC due to soot.

According to an aspect of the present disclosure, a method of manufacturing a radiation imaging apparatus includes electrically connecting a first surface of a flexible insulating layer to a conductive portion of a circuit substrate having an integrated circuit mounted on the circuit substrate, wherein the flexible insulating layer includes, on the first surface, a plurality of pixels arranged in a two-dimensional matrix to convert radiation into an electrical signal, covering, with a protection layer, an exposed portion of the conductive portion exposed by the connecting, and after covering, separating the flexible insulating layer from a substrate in contact with a second surface of the flexible insulating layer opposite to the first surface of the flexible insulating layer by irradiating the second surface with light transmitting through the substrate.

Further features of the present disclosure will become apparent from the following description of exemplary embodiments with reference to the attached drawings.

DESCRIPTION OF THE EMBODIMENTS

Figure 1:
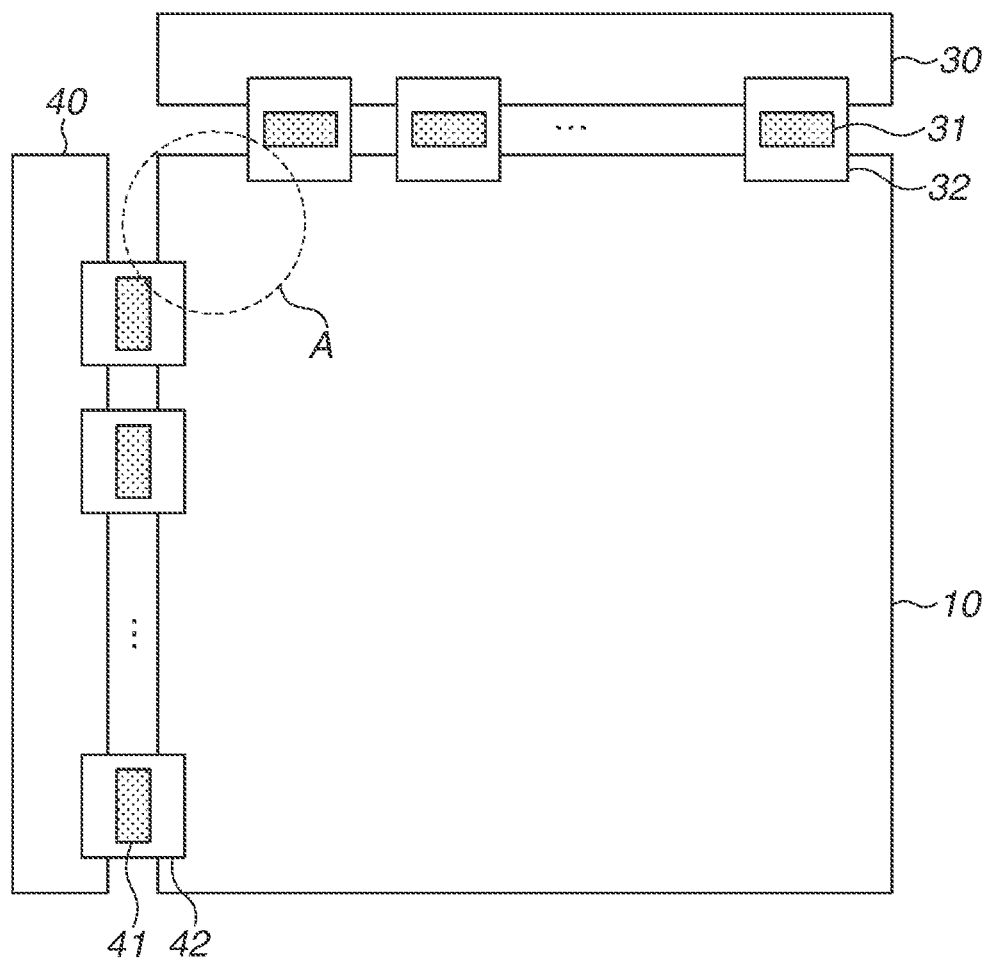
FIG. 1 is a plan view illustrating a state where an integrated circuit is coupled to a flexible radiation detection panel according to a first exemplary embodiment.

FIG. 1 is a plan view illustrating a state where an integrated circuit is coupled to a flexible radiation detection panel according to a first exemplary embodiment.

Two types of integrated circuits (a readout circuit 31 and a drive circuit 41) mounted on a circuit substrate are coupled to a radiation detection panel 10. The readout circuit 31 is a circuit configured to read out electrical signals from a plurality of pixels 15 provided on a matrix panel 11 included in the radiation detection panel 10. The readout circuit 31 is coupled to a readout device 30 via a readout wiring member 32. The drive circuit 41 is a circuit configured to supply drive signals to the plurality of pixels 15. The drive circuit 41 is coupled to a drive device 40 via a driving wiring member 42.

According to the present exemplary embodiment, these two types of wiring members, i.e., the readout wiring member 32 and the driving wiring member 42, include flexible printed boards (FPCs). These wiring members preferably include FPCs from an aspect of space-saving wiring, but the wiring members may include flexible flat cables (FFCs) and may have any form as long as the wiring members can electrically connect the radiation detection panel 10 and the integrated circuits.

An area A enclosed by a dashed line in FIG. 2 is illustrated in an enlarged plan view of FIG. 3, and thus the area A is described below in detail in the description section of FIG. 3.

Figure 2A:
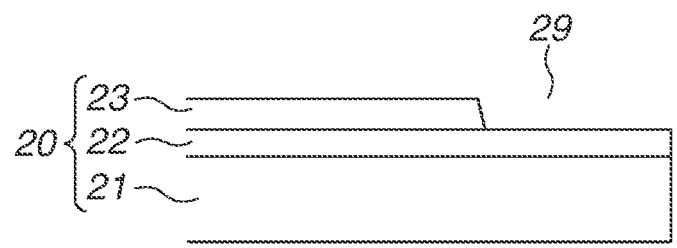
FIGS. 2A and 2B are structural diagrams of a flexible printed board (FPC) used for a readout wiring member and a driving wiring member according to the first exemplary embodiment.
Figure 2B:
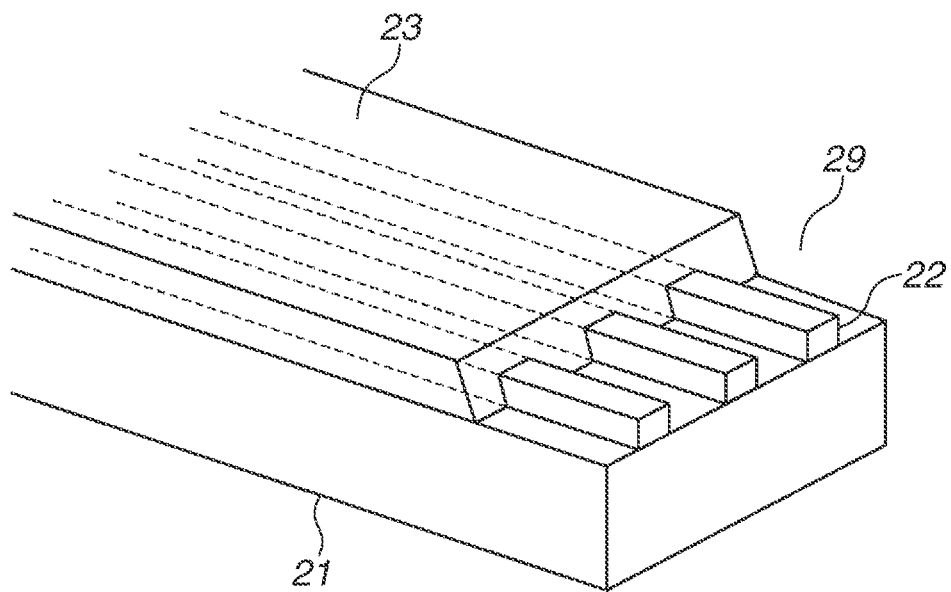

FIGS. 2A and 2B are structural diagrams of an FPC 20 that may be used for the readout wiring member 32 and the driving wiring member 42. The FPC 20 includes a base material 21, a conductive portion 22, and a conductive portion coating layer 23. The base material 21 and the conductive portion coating layer 23 are formed of an organic insulating material such as polyimide. The plurality of conductive portions 22 formed of a conductor such as copper is arranged to extend toward an integrated circuit (the readout circuit 31 or the drive circuit 41) (not illustrated) mounted on the FPC 20. The plurality of conductive portions 22 connects the pixels in the radiation detection panel 10 to the integrated circuit.

Although the number of the conductive portions 22 is three for the sake of simplicity of description, the number of the conductive portions 22 may be a large number such as 250 or 500 in accordance with the configuration. Although most of the conductive portion 22 is covered with the conductive portion coating layer 23, there is a portion where the conductive portion 22 is exposed without being provided with the conductive portion coating layer 23 near the edge portion to establish an electrical connection with the matrix panel 11. A portion where the conductive portion 22 is exposed is hereinafter referred to as "exposed portion 29".

Figure 3:
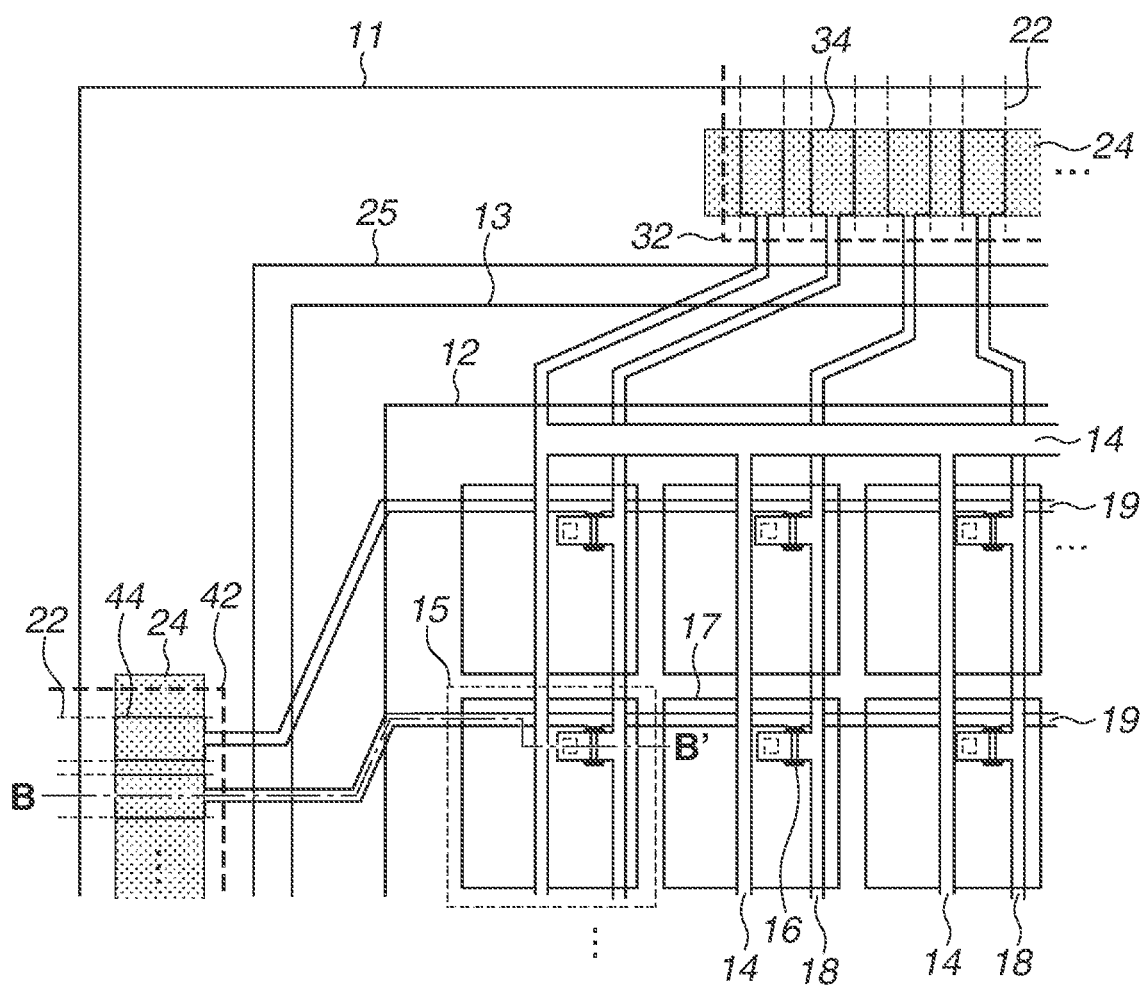
FIG. 3 is an enlarged plan view of an area A illustrated in FIG. 1 according to the first exemplary embodiment.

FIG. 3 is an enlarged plan view of the area A illustrated in FIG. 1. The flexible radiation detection panel 10 includes the matrix panel 11 and a scintillator 12, both of which are flexible. The matrix panel 11 has the plurality of pixels 15 formed in a two-dimensional matrix on a flexible insulating layer described below. The pixel 15 includes a switch element 16 and a conversion element 17. The B-B' portion illustrated in FIG. 3 is described below in the description of FIGS. 5 to 10.

According to the present exemplary embodiment, the switch element 16 and the conversion element 17 are an amorphous silicon thin-film transistor (a-Si TFT) and a metal-insulator-semiconductor (MIS) type photoelectric conversion element, respectively. The switch element 16 and the conversion element 17 are not limited to the above combination, but any known technique, such as polysilicon TFT, oxide TFT, or PIN type photoelectric conversion element, may be used.

The matrix panel 11 further includes a plurality of gate lines 19 extending in a row direction, a plurality of signal lines 18 extending in a column direction, and bias lines 14 supplying a bias voltage to each of the conversion elements 17. The scintillator 12 converts radiation such as X-rays into visible light. As the scintillator 12, gadolinium oxysulfide (GOS) mixed with a binder or cesium iodide (CsI) with thallium (Tl) or sodium (Na) as an activator may be used.

A scintillator moisture-proof layer 13 may be formed to protect the scintillator 12 from humidity in the environment. As the scintillator moisture-proof layer 13, it is possible to use metals such as aluminum, copper, and stainless steel, resins such as poly-para-xylylene, epoxy resin, acrylic resin, and polyester resin, and composite materials including a resin and a ceramic such as alumina and titanium oxide.

The scintillator moisture-proof layer 13 may be formed of a conductor such as metal and connected to a predetermined potential to have a protection (electromagnetic shielding) function from electromagnetic radiation noise. A planarized layer 25 may be formed with an organic insulating layer, such as polyimide, to obtain planarity and impact resistance during scintillator formation.

The respective signal lines 18 are electrically connected to a plurality of readout connecting portions 34 provided on the matrix panel 11. The readout wiring member 32 mounted on the matrix panel 11 includes the conductive portions 22 disposed in opposition to the respective readout connecting portions 34. Each of the conductive portions 22 is electrically connected to the readout connecting portion 34 via a conductive adhesive 24 including an anisotropic conductive film (ACF).

Similarly, the respective gate lines 19 are electrically connected to a plurality of driving connecting portions 44. The driving wiring member 42 mounted on the matrix panel 11 includes the conductive portions 22 disposed in opposition to the respective driving connecting portions 44. Each of the conductive portions 22 is electrically connected to the driving connecting portion 44 via the conductive adhesive 24. Thus, each of the pixels 15 is electrically connected to the readout circuit 31 and the drive circuit 41.

Figure 4:
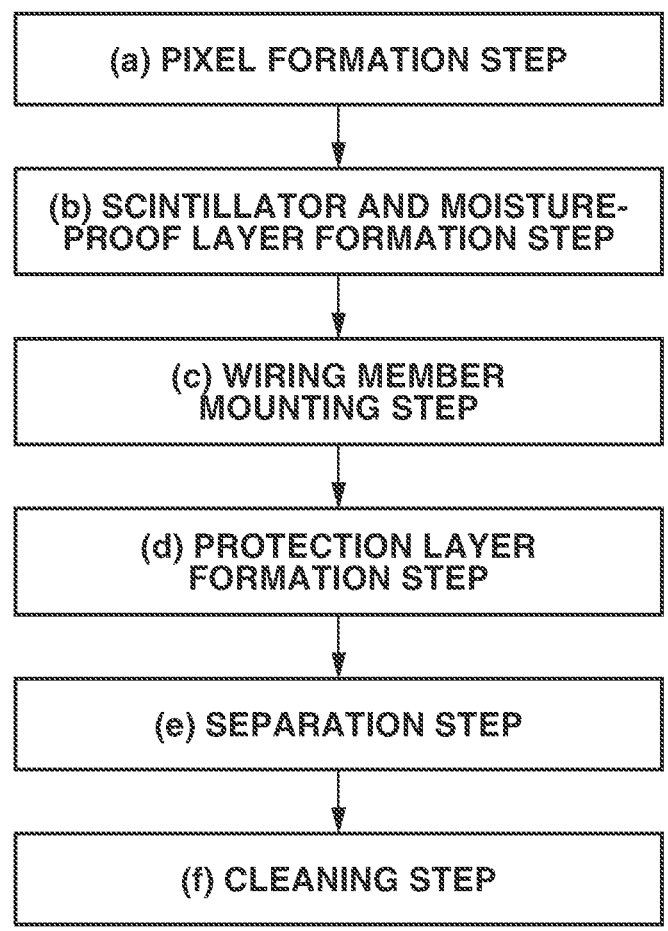
FIG. 4 is a step block diagram illustrating an example of a manufacturing method of the radiation detection panel according to the first exemplary embodiment.

FIG. 4 is a step block diagram illustrating an example of a manufacturing method of the radiation detection panel 10. FIGS. 5 to 10 are cross-sectional views of the radiation detection panel 10 corresponding to steps (a) to (f) of FIG. 4 on the cross section of the B-B' portion illustrated in FIG. 3. An example of the manufacturing process of the radiation detection panel 10 will be described in detail with reference to FIGS. 5 to 10.

(a) Pixel Formation Step

Figure 5:
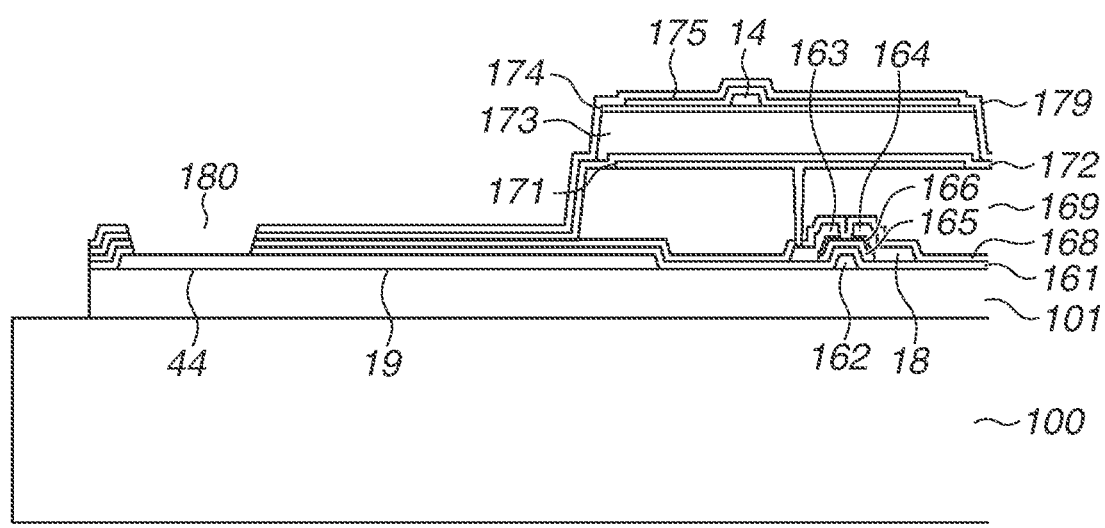
FIG. 5 is a cross-sectional view of the radiation detection panel in a step (a) illustrated in FIG. 4 according to the first exemplary embodiment.

FIG. 5 is a cross-sectional view of the radiation detection panel 10 in a pixel formation step. A flexible insulating layer 101 made of a polymer material such as polyimide is formed on a substrate 100 such as glass.

The flexible insulating layer 101 may be formed, for example, by coating the substrate 100 with a solution of polyimide and then baking, or by attaching, to the substrate 100, a polyimide film or the like separately formed in a form of a film. A "first surface" of the "flexible insulating layer" according to the present disclosure is an upper surface of the flexible insulating layer 101 where the pixels 15 are formed in FIG. 5, and a "second surface" is a lower surface of the flexible insulating layer 101 in contact with the substrate 100 in FIG. 5.

The switch element 16 is subsequently formed on the flexible insulating layer 101. The switch element 16 is obtained by forming, on a surface of the flexible insulating layer 101 opposite to the surface in contact with the substrate 100, a gate electrode 162, a gate insulating layer 161, a first a-Si layer 165, a first n+-Si layer 166, a drain electrode 163, and a source electrode 164.

On the switch element 16, a first inorganic insulating layer 168 and an organic planarization layer 169 are sequentially formed. Furthermore, a lower electrode 171, a sensor inorganic insulating layer 172, a second a-Si layer 173, a second n+-Si layer 174, a bias line 14, and an upper electrode 175 are formed to obtain the conversion element 17. These layers are covered with a second inorganic insulating layer 179 to obtain a passivation layer. Finally, the second inorganic insulating layer 179, the sensor inorganic insulating layer 172, the first inorganic insulating layer 168, and the gate insulating layer 161 above the driving connecting portion 44 are etched to provide an opening 180 and obtain the matrix panel 11.

(b) Scintillator and Moisture-proof Layer Formation Step

Figure 6:
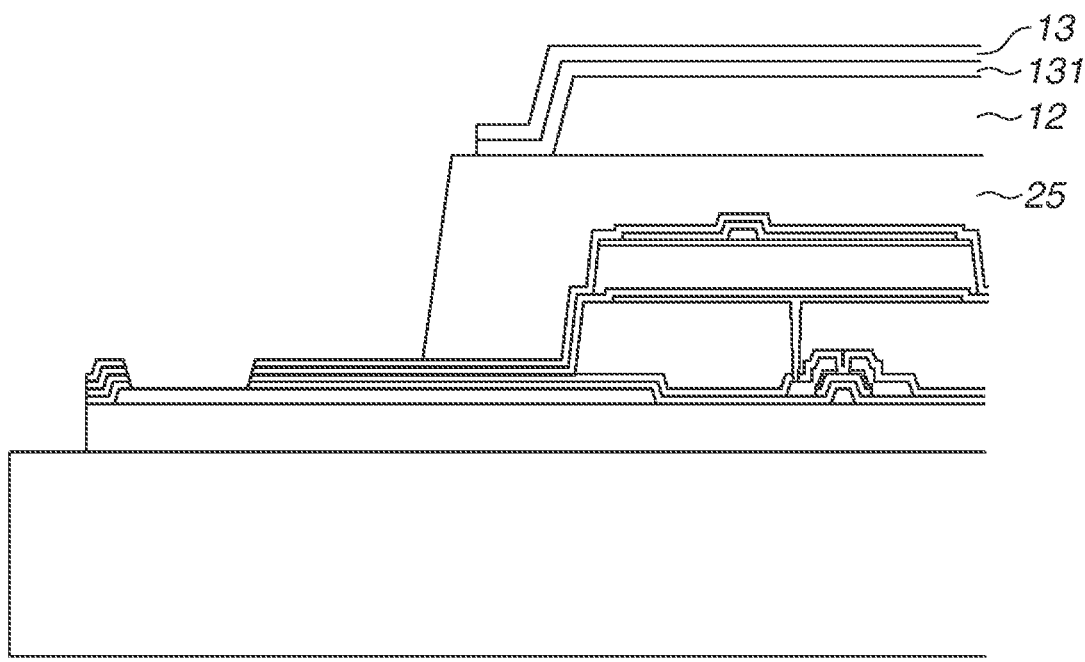
FIG. 6 is a cross-sectional view of the radiation detection panel in a step (b) illustrated in FIG. 4 according to the first exemplary embodiment.

FIG. 6 is a cross-sectional view of the radiation detection panel 10 in a scintillator and moisture-proof layer formation step. The planarized layer 25 is formed with polyimide on the second inorganic insulating layer 179. Thereafter, a CsI thin film having a desired thickness is formed on the planarized layer 25 by vacuum evaporation to obtain the scintillator 12. The scintillator moisture-proof layer 13 made of a laminated composite material of aluminum and resin is attached to the scintillator 12 via an adhesive layer 131.

(c) Wiring Member Mounting Step

Figure 7:
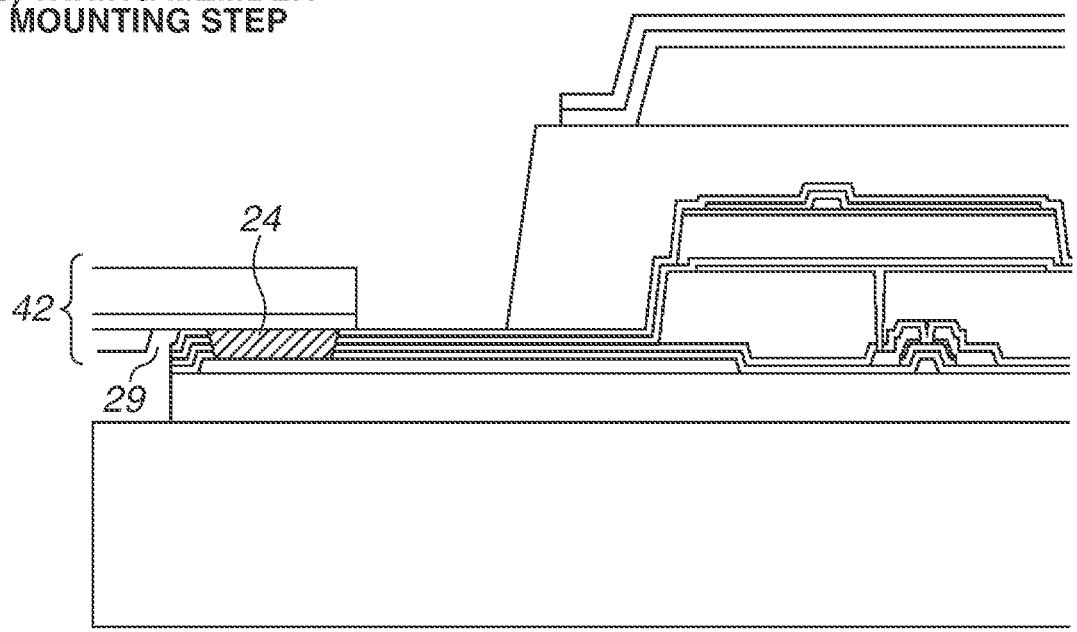
FIG. 7 is a cross-sectional view of the radiation detection panel in a step (c) illustrated in FIG. 4 according to the first exemplary embodiment.

FIG. 7 is a cross-sectional view of the radiation detection panel 10 in a wiring member mounting step. A layer of the conductive adhesive 24 is formed to fill the opening 180. The driving wiring member 42 and the readout wiring member 32 (not illustrated) are mounted on the matrix panel 11 such that the respective conductive portions 22 in the driving wiring member 42 and the readout wiring member 32 are electrically connected to the driving connecting portions 44 and the readout connecting portions 34 on the matrix panel 11.

Although most of the exposed portions 29 of the driving wiring member 42 and the readout wiring member 32 are filled with the conductive adhesive 24 and thus disappear, a portion of the exposed portion 29 remains as illustrated in FIG. 7. Soot described below adhering to or accumulating in the remaining portion may cause operation failures or reading failures of the matrix panel 11.

(d) Protection Layer Formation Step

Figure 8:
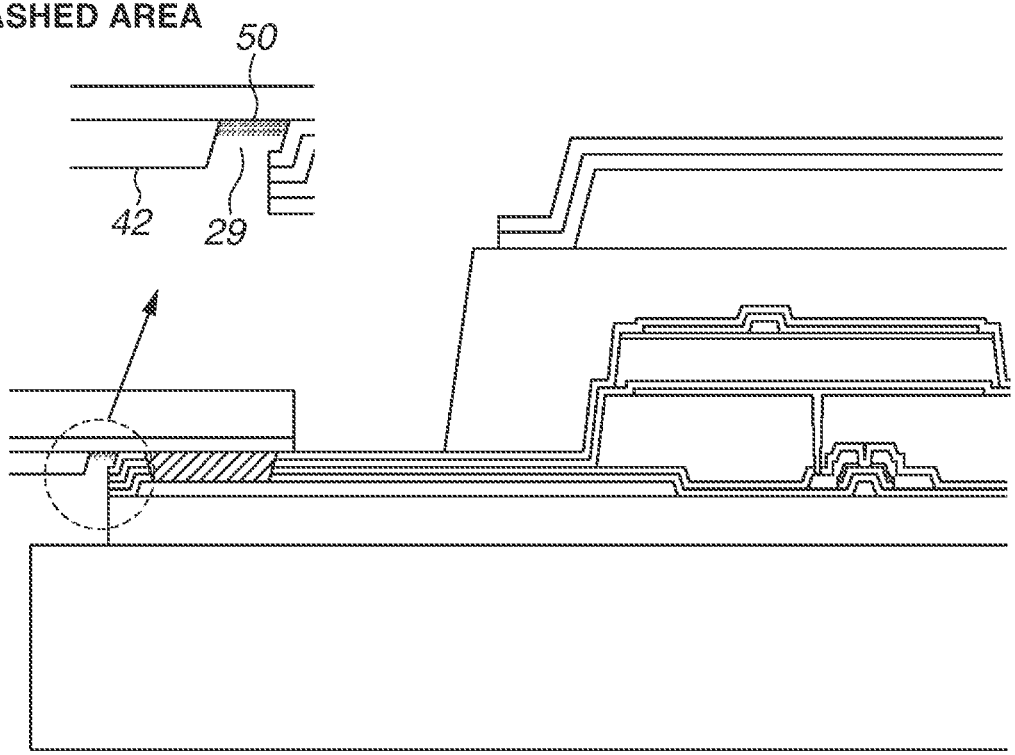
FIG. 8 is a cross-sectional view of the radiation detection panel in a step (d) illustrated in FIG. 4 according to the first exemplary embodiment.

FIG. 8 is a cross-sectional view of the radiation detection panel 10 in a protection layer formation step. At the exposed portion 29, a protection layer 50 is formed using an insulating member to cover the conductive portion 22. Known techniques such as coating, vapor deposition, and adhesion may be used as a formation method. The protection layer 50 may have any particular thickness and form, as long as the protection layer 50 is effective in preventing adhesion and accumulation of soot described below.

Instead of covering with a continuous film, covering by adhesion in a patchy manner, for example, a dot pattern, may be used. A specific example of the protection layer 50 is described below.

(e) Separation Step

Figure 9:
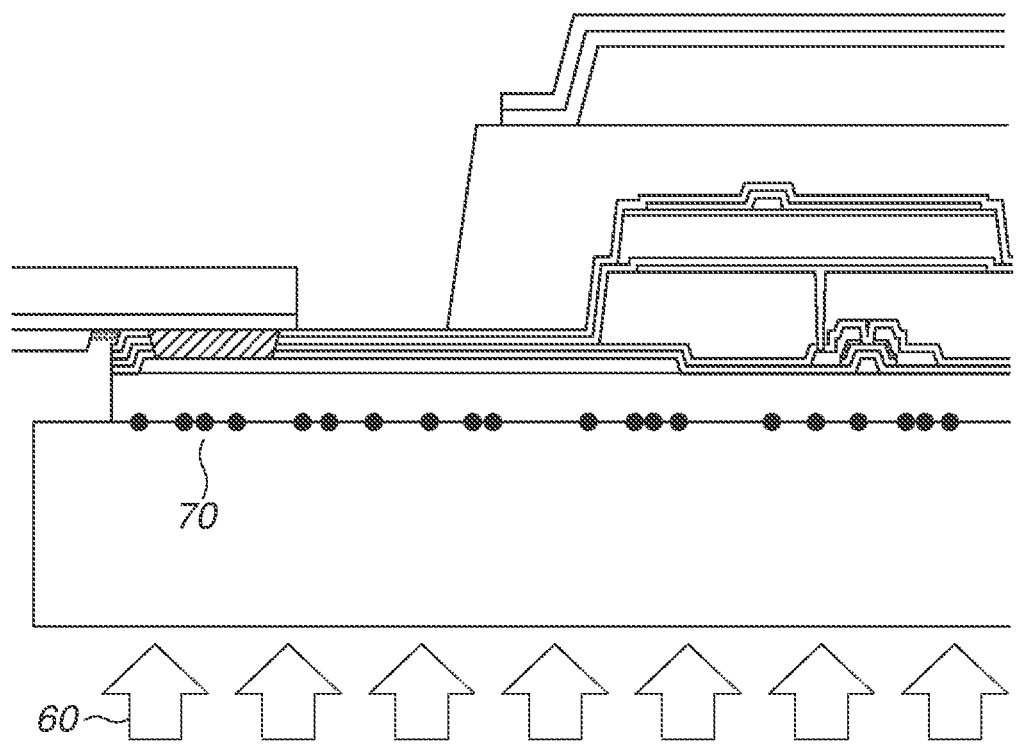
FIG. 9 is a cross-sectional view of the radiation detection panel in a step (e) illustrated in FIG. 4 according to the first exemplary embodiment.

FIG. 9 is a cross-sectional view of the radiation detection panel 10 in a separation step. The flexible insulating layer 101 is irradiated with light 60 through the substrate 100 on the surface opposite to the surface where the pixels 15 and the scintillator 12 are formed at the flexible insulating layer 101. The wavelength of the light 60 is preferably a wavelength that substantially transmits through the substrate 100 and is efficiently absorbed by the flexible insulating layer 101. The intensity (energy density, unit: mJ/cm2) of the light 60 is preferably more than or equal to an ablation threshold of the flexible insulating layer 101.

When the light 60 having an intensity more than or equal to the ablation threshold is incident, a portion of the flexible insulating layer 101 near the interface with the substrate 100 is ablated, which results in separation from the substrate 100. Simultaneously, a different portion of the flexible insulating layer 101 is carbonized, which causes soot 70 appear at the interface with the substrate 100. Although the ablation threshold of a polyimide material is 150 to 170 mJ/cm2, it is preferable to set the intensity of the light 60 to an intensity sufficiently higher than the ablation threshold in consideration of, for example, temporal fluctuations of laser output and intensity distribution on an object.

If the intensity is too high, a large amount of soot occurs. If the substrate 100 is alkali-free glass (e.g., EAGLE XG®) and the flexible insulating layer 101 is polyimide, an excimer laser or a solid-state laser is used as a light source of the light 60 that satisfies conditions of the above-described wavelength and intensity.

For example, a third harmonic (355 nm) of a Nd:YAG laser, which is a type of solid-state laser, may be shaped for a beam as appropriate and swept over the flexible insulating layer 101 during repeated pulse irradiation.

(f) Cleaning Step

Figure 10:
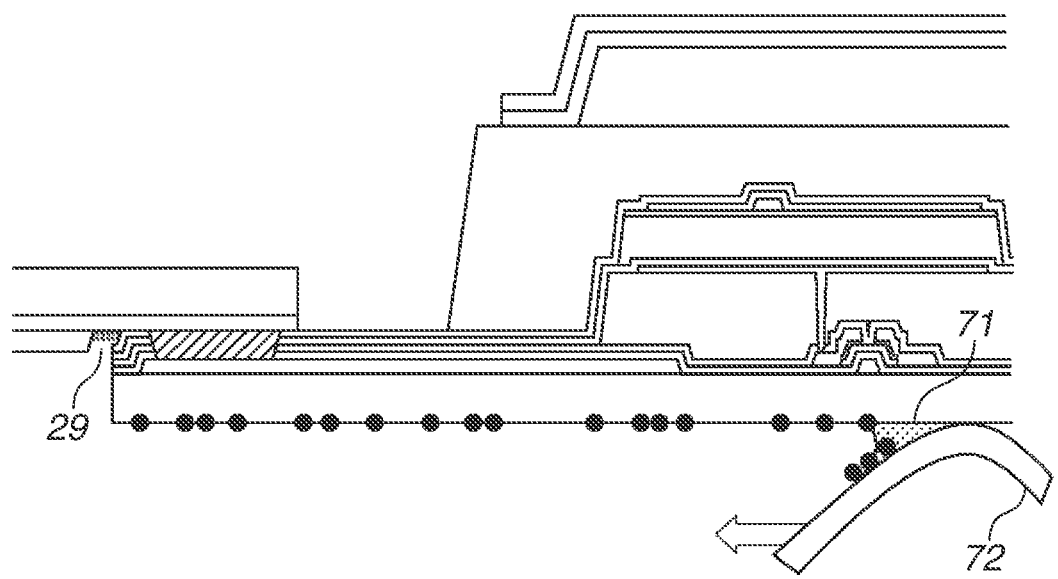
FIG. 10 is a cross-sectional view of the radiation detection panel in a step (f) illustrated in FIG. 4 according to the first exemplary embodiment.

FIG. 10 is a cross-sectional view of the radiation detection panel 10 in a cleaning step. After the substrate 100 is removed, the soot 70 generated on the entire lower surface of the flexible insulating layer 101 is removed. Various cleaning methods may be used, such as dry-type cleaning method (e.g., suction with an electric vacuum cleaner, and adsorption with adhesive tape), and wet-type cleaning method (e.g., wiping with a solvent, and immersion). In particular, wiping with a cloth 72 impregnated with an organic solvent 71 such as isopropyl alcohol is effective, as illustrated in FIG. 10.

For example, any of the following may be used as the protection layer 50 according to the present exemplary embodiment.

Antistatic agent: An antistatic agent including a surfactant is dispersed in a solvent such as water, and the exposed portion 29 is sprayed or coated with the solvent and dried to form a protection layer 50. The antistatic agent attracts water vapor in the environmental atmosphere so as to prevent adhesion and accumulation of the soot 70 caused by static electricity. Since the antistatic agent is vulnerable to wiping, it is preferable to use a dry-type cleaning method for the cleaning step. The protection layer 50 using the antistatic agent has low conductivity (surface resistivity of 1012 Ω/sq or less), and therefore, when this is at issue, the soot is removed in the dry-type cleaning step and then the wet-type (wiping) cleaning step may be separately performed to remove the antistatic agent. Alternatively, the surface of an insulating member may be sprayed or coated with an antistatic agent as the protection layer 50, and then be dried so that the surface of the insulating member has an antistatic function.

Water-repellent treatment agent: The exposed portion 29 is sprayed or coated with a water-repellent treatment agent, such as SFCOAT® (manufactured by AGC Seimi Chemical Co., Ltd.) or TOYAL LOTUS® (manufactured by Toyo Aluminium K.K.), and is dried to form a protection layer 50. These water-repellent treatment agents are effective in lowering the surface energy of the exposed portion 29 and preventing adhesion and accumulation of the soot 70.

Figure 11A:
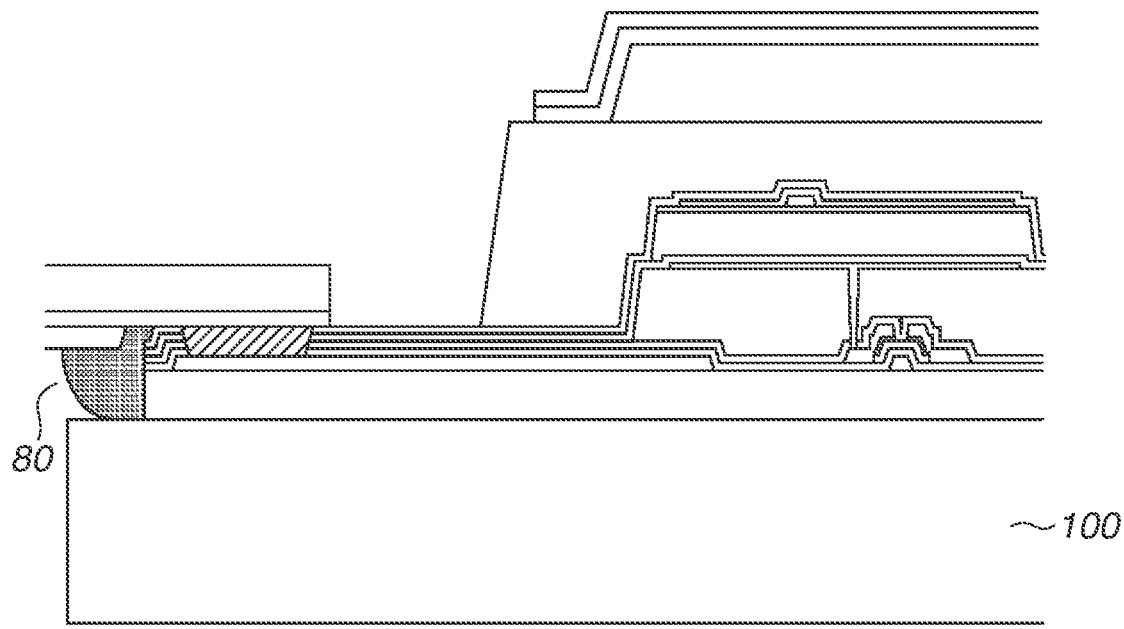
FIGS. 11A and 11B are cross-sectional views of the radiation detection panel, illustrating a protection layer formation step and a separation step according to a second exemplary embodiment.

FIG. 11A is a cross-sectional view of the radiation detection panel 10, illustrating a protection layer formation step according to a second exemplary embodiment. FIG. 11A corresponds to FIG. 8 according to the first exemplary embodiment. A difference between the present exemplary embodiment and the first exemplary embodiment is that a sealing material 80 functions as the protection layer 50, and the other configurations and steps are the same. The sealing material 80 is formed to cover the exposed portion 29 and prevents adhesion and accumulation of the soot 70. The sealing material 80 may be any material as long as the sealing material 80 may prevent adhesion and accumulation of the soot 70. Examples of the sealing material 80 may be silicone resin, epoxy resin, or acrylic resin. As illustrated in FIG. 11A, a portion of the sealing material 80 may be in contact with the substrate 100.

Figure 11B:
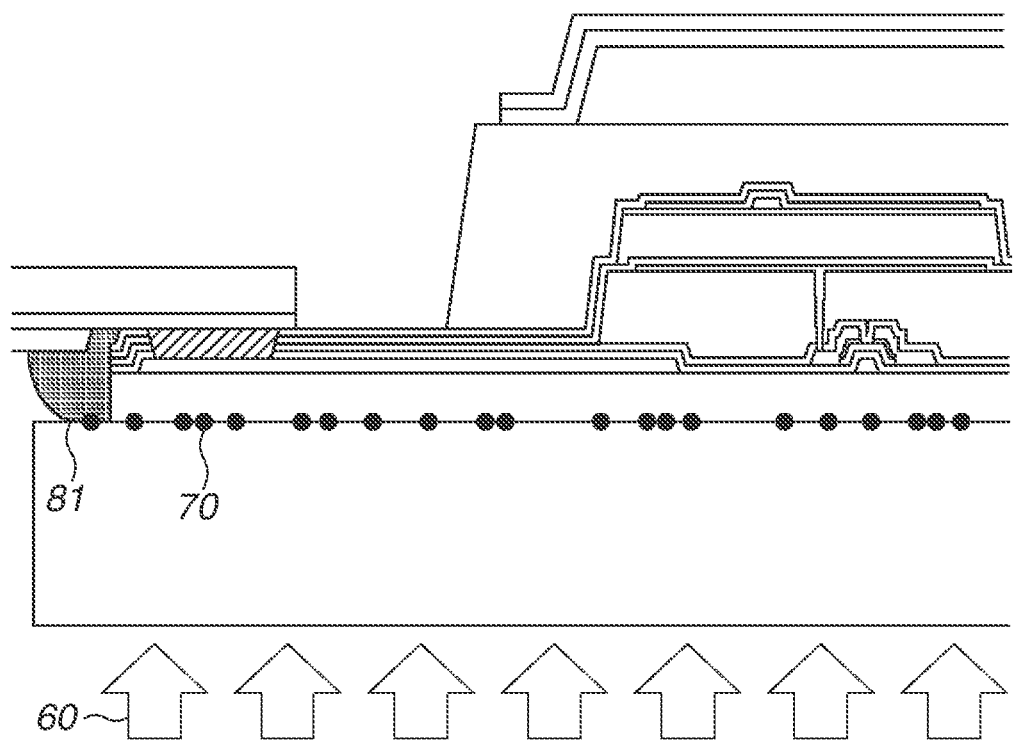

FIG. 11B is a cross-sectional view of the radiation detection panel 10, illustrating a separation step according to the present exemplary embodiment. FIG. 11B corresponds to FIG. 9 according to the first exemplary embodiment. If a portion of the sealing material 80 is formed in contact with the substrate 100 in the protection layer formation step, a lower surface of a portion (contact portion) 81 in contact with the substrate 100 has a plane substantially identical to the lower surface of the flexible insulating layer 101. The contact portion 81 may be partially ablated by the light 60 in the same manner as the flexible insulating layer 101.

Figure 12:
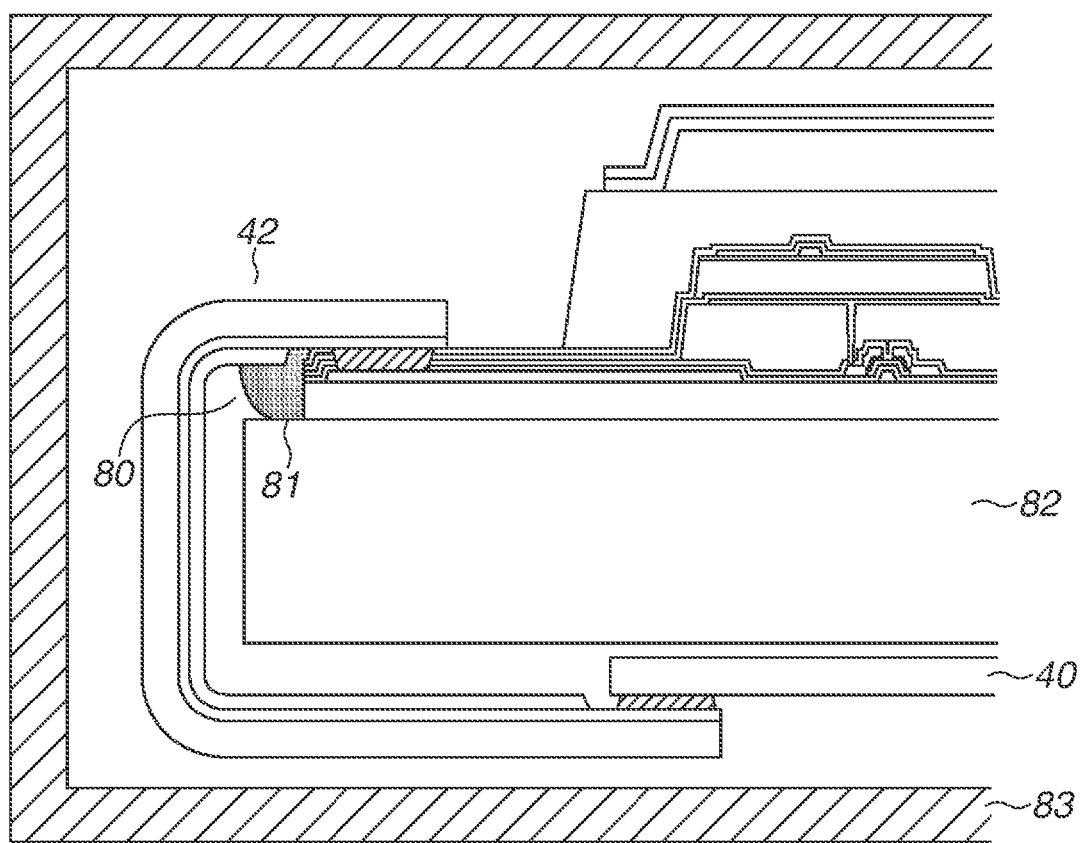
FIG. 12 is a cross-sectional view of a radiation imaging apparatus using the radiation detection panel according to the second exemplary embodiment.

FIG. 12 is a cross-sectional view illustrating a portion of a radiation imaging apparatus using the radiation detection panel according to the present exemplary embodiment. The flexible insulating layer 101 and the drive device 40 are fixed to a support base 82 with an adhesive and a screw, respectively. The support base 82 is fixed with a screw to a casing 83 of an imaging device. The driving wiring member 42 is coupled to the matrix panel 11 and the drive device 40 with, for example, the conductive adhesive 24, and no other mechanical fixing may be used.

According to the present exemplary embodiment, the sealing material 80 has the effect of protecting connecting electrodes from a foreign substance other than soot, dirt, humidity, etc., in addition to the same effect as that of the first exemplary embodiment.

If a portion of the sealing material 80 is formed to be in contact with the substrate 100 in the protection layer formation step, the effect described below may be obtained. Specifically, the sealing material 80 is configured to be in surface contact with the support base 82 at the contact portion 81. The impact applied to the driving wiring member 42 is thereby dispersed and reduced even if the casing 83 is subjected to an impact such as an external force. The readout wiring member 32 also achieves the same effect by using the sealing material 80 having the same shape as described above. That is, the stable electrical connection between the pixel and the external circuit is maintained even under an impact such as an external force, and the reliability of the radiation imaging apparatus is improved.

Figure 13:
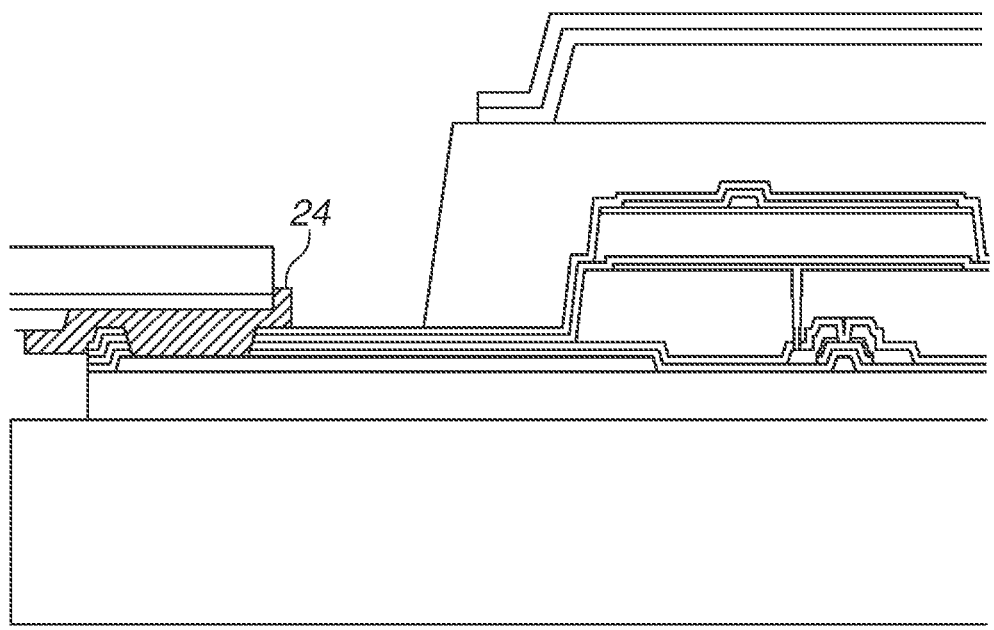
FIG. 13 is a cross-sectional view of the radiation detection panel and a wiring member, illustrating a wiring member mounting step according to a third exemplary embodiment.

FIG. 13 is a cross-sectional view illustrating a wiring member mounting step according to a third exemplary embodiment. FIG. 13 corresponds to FIGS. 7 and 8 according to the first exemplary embodiment. A difference between the present exemplary embodiment and the first exemplary embodiment is that the conductive adhesive 24 functions as the protection layer 50. The wiring member mounting step according to the present exemplary embodiment also serves as the protection layer formation step ((d) in FIG. 4, and FIG. 8). The other configurations and steps are the same as those in the first exemplary embodiment. The conductive adhesive 24 is formed to cover the exposed portion 29 and prevents adhesion and accumulation of the soot 70.

Since the conductive adhesive 24 also serves as the protection layer 50 according to the present exemplary embodiment, the same effect as that in the first exemplary embodiment may be obtained simply and at low cost.

The present disclosure may reduce operation failures caused by soot in the radiation imaging apparatus using the flexible matrix panel.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2020-205575, filed Dec. 11, 2020, which is hereby incorporated by reference herein in its entirety.

What is claimed is:

1. A method of manufacturing a radiation imaging apparatus, the method comprising:
supporting a second surface of a flexible circuit board with a light transmissive member, the flexible circuit board including a plurality of pixels arranged in a two-dimensional matrix;
electrically connecting a wiring member to a connecting portion provided at an end of a first surface of the flexible circuit board, wherein the connecting portion is electrically connected to at least one of the plurality of pixels;
covering, with an insulating member, an electrically exposed portion of the wiring member in a vicinity of the connection portion; and after covering,
separating the flexible circuit board from the light transmissive member by irradiating the second surface with light transmitting through the light transmissive member.

2. The method according to claim 1, the method further comprising cleaning, after separating the flexible circuit board from the light transmissive member, to remove a conductive foreign substance generated by the separating.

3. The method according to claim 2, further comprising removing the insulating member after the cleaning.

4. The method according to claim 1, further comprising forming a scintillator on the first surface.

5. The method according to claim 1, wherein an integrated circuit is mounted on the wiring member, and the integrated circuit is at least either one of a drive circuit configured to supply a drive signal to the plurality of pixels and a readout circuit configured to read out an electrical signal from the plurality of pixels.

6. The method according to claim 1, wherein the insulating member is an antistatic agent.

7. The method according to claim 1, wherein the insulating member is a water-repellent treatment agent.

8. The method according to claim 1, wherein the insulating member is a sealing material.

9. The method according to claim 1, wherein the insulating member is a conductive adhesive.

10. A radiation imaging apparatus comprising:
a flexible circuit board including a plurality of pixels arranged in a two-dimensional matrix, wherein the flexible circuit board having a connecting portion provided at an end of a first surface of the flexible circuit board, wherein the connecting portion is electrically connected to at least one of the plurality of pixels;
a wiring member configured to connect to the connecting portion; and
an insulating member configured to cover an electrically exposed portion of the wiring member in a vicinity of the connection portion, wherein the cover is configured to protect the electrically exposed portion from a conductive foreign substance generated on a second surface of the flexible circuit board opposite to the first surface when the flexible circuit board is separated from a light transmissive member in contact with the second surface with light transmitting through the light transmissive member.

11. The radiation imaging apparatus according to claim 10, wherein the first surface is provided with a scintillator.

12. The radiation imaging apparatus according to claim 10, wherein an integrated circuit mounted is mounted on the wiring member, and the integrated circuit is at least either one of a drive circuit configured to supply a drive signal to the plurality of pixels and a readout circuit configured to read out an electrical signal from the plurality of pixels.

13. The radiation imaging apparatus according to claim 10, wherein a surface of the insulating member has an antistatic function.

14. The radiation imaging apparatus according to claim 10, wherein the insulating member has a water-repellent function.

15. The radiation imaging apparatus according to claim 10, wherein the insulating member is a sealing material.

16. The radiation imaging apparatus according to claim 10, wherein the insulating member is a conductive adhesive.

* * * * *